(12) United States Patent
Gambini

(10) Patent No.: US 12,719,422 B2
(45) Date of Patent: Aug. 25, 2026

(54) POWER AMPLIFIER AND FILTERING CIRCUITRY

(71) Applicant: Apple Inc., Cupertino, CA (US)

(72) Inventor: Simone Gambini, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 649 days.

(21) Appl. No.: 18/106,899

(22) Filed: Feb. 7, 2023

(65) Prior Publication Data

US 2024/0267010 A1 Aug. 8, 2024

(51) Int. Cl.
*H03F 3/24* (2006.01)
*H04B 1/40* (2015.01)

(52) U.S. Cl.
CPC ............... *H03F 3/245* (2013.01); *H04B 1/40* (2013.01); *H03F 2200/451* (2013.01); *H03F 2203/21151* (2013.01)

(58) Field of Classification Search
CPC ............. H03F 1/3252; H03F 1/02; H03F 1/07
USPC ...................................... 330/126, 124 R, 295
See application file for complete search history.

(56) References Cited

U.S. PATENT DOCUMENTS 6,856,192 B2 * 2/2005 Muramatsu ........... H03F 3/2173 330/10
7,196,582 B2 3/2007 Darabi et al.
7,602,245 B2 * 10/2009 You ....................... H03F 3/2171 330/10
8,237,531 B2 8/2012 Qiu et al.
8,373,251 B2 2/2013 Uchida et al.
9,020,453 B2 * 4/2015 Briffa .................. H04B 1/0483 455/127.1
9,306,502 B2 * 4/2016 Chan ..................... H03F 1/0277
11,095,329 B1 * 8/2021 Alagry ................. H03H 11/342
11,159,126 B2 10/2021 Chen et al.
2004/0075490 A1 * 4/2004 Jeong ....................... H03H 7/09 330/10
2011/0260797 A1 * 10/2011 Lee ......................... H03F 3/211 330/124 R
2016/0254786 A1 * 9/2016 Takahashi ............. H03F 3/2173 330/251
2019/0312604 A1 * 10/2019 Huang ...................... H03F 3/68

(Continued)

OTHER PUBLICATIONS

Aoki et al., "A Fully-Integrated Quad-Band GSM/GPRS CMOS Power Amplifier," Dec. 10, 2008, IEEE Journal of Solid-State Circuits, vol. 43, No. 12, pp. 2747-2758.

(Continued)

*Primary Examiner* — Henry Choe
(74) *Attorney, Agent, or Firm* — FLETCHER YODER PC

(57) ABSTRACT

This disclosure is directed to a power amplifier (PA) including circuitry to amplify and filter transmission signals in a radio frequency (RF) circuit. The PA may include multiple core amplifiers coupled to a power combiner to amplify and filter the transmission signals. For example, the PA may activate the core amplifiers to provide the transmission signals with a peak output power. Alternatively, the PA may activate a reduced number of the core amplifiers to provide the transmission signals with a reduced output power lower than the peak output power. Activating a portion of the PA when providing the transmission signals with a reduced output power may reduce a power consumption and improve power efficiency of the PA.

19 Claims, 7 Drawing Sheets

(56) References Cited

U.S. PATENT DOCUMENTS

| | | | | |
|---|---|---|---|---|
| 2021/0006275 | A1 | 1/2021 | Langer et al. | |
| 2021/0050818 | A1 | 2/2021 | Buckwalter et al. | |
| 2022/0393650 | A1 | 12/2022 | Ayranci et al. | |
| 2022/0416736 | A1 | 12/2022 | Ben-Haim et al. | |
| 2023/0126116 | A1* | 4/2023 | Husain .................... | H03F 3/193<br>330/250 |

OTHER PUBLICATIONS

Nazari et al., "A CMOS Two-Element 170-GHz Fundamental-Frequency Transmitter With Direct RF-8PSK Modulation," Jan. 28, 2020, IEEE Journal of Solid-State Circuits, vol. 55, No. 2, pp. 282-297.

* cited by examiner

POWER AMPLIFIER AND FILTERING CIRCUITRY

BACKGROUND

The present disclosure relates generally to wireless communication, and more specifically to amplifying and filtering wireless transmission signals.

A wireless communication device may include a transmitter and one or more antennas for transmission of wireless signals. The transmitter may include a power amplifier for increasing an output power of transmission signals to facilitate wireless communication via the antennas. The power amplifier may draw electrical power for amplifying the transmission signals. However, in some cases, the power amplifier may draw an undesired amount of electrical power for amplifying the transmission signals. Moreover, the transmitter may include a filter to reduce a power of undesired signals before providing the transmission signals to the antennas. However, the filtering circuitry may occupy an undesired amount of area in the wireless communication device.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a power amplifier is described including a first core amplifier that may provide a first amplified signal, a second core amplifier that may provide a second amplified signal, and a power combiner that may couple to a load. The power combiner may include a first inductor having a first terminal coupled to the first core amplifier, a first capacitor coupled to a second terminal of the first inductor, a second inductor having a second terminal coupled to the second core amplifier, the first inductor and the second inductor being disposed on a first plane, and a second capacitor coupled to a third terminal of the second inductor.

In another embodiment, an electronic device may include a processor, one or more antennas, and a power combiner coupled to the one or more antennas. The power combiner may include a first core amplifier coupled to the processor, a second core amplifier coupled to the processor, and a third core amplifier. The power combiner may also include a first inductor having a first terminal coupled to the first core amplifier, a second inductor having a second terminal coupled to the second core amplifier, the first inductor and the second inductor being disposed on a first plane, and a third inductor having a fourth terminal of the third inductor coupled to the third core amplifier disposed on the first plane.

In yet another embodiment, a method including receiving, by a processor, a request to transmit transmission signals via one or more antennas of an electronic device, receiving, by the processor, an output power of a power amplifier of the electronic device for providing the transmission signals to the one or more antennas, activating, by the processor, a first core amplifier of the power amplifier based on the output power being below a first threshold, and activating, by the processor, the first core amplifier and a second core amplifier of the power amplifier based on the output power being below a second threshold higher than the first threshold.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
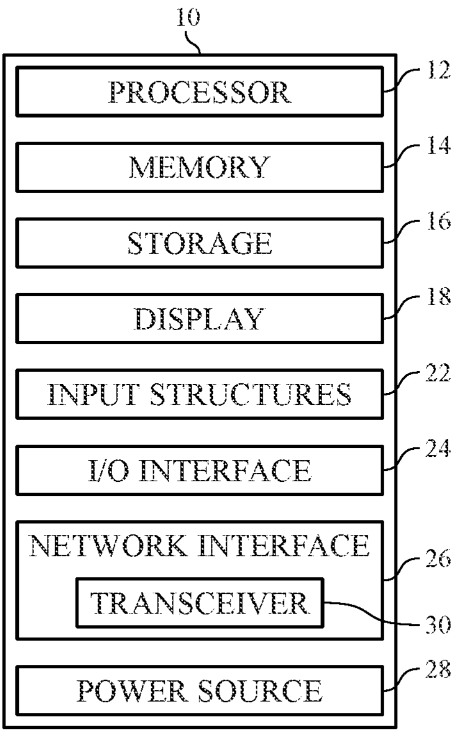
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements.

The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term "set" may include one or more. That is, a set may include a unitary set of one member, but the set may also include a set of multiple members.

This disclosure is directed to a power amplifier (PA) including circuitry to amplify and filter transmission signals in a radio frequency (RF) circuit. The PA may include multiple core amplifiers coupled to a power combiner to amplify and filter the transmission signals. For example, the PA may activate the core amplifiers to provide the transmission signals with a peak output power. Alternatively, the PA may activate a reduced number of the core amplifiers to provide the transmission signals with a reduced output power lower than the peak output power. Activating a portion of the PA when providing the transmission signals with a reduced output power (e.g., −6 decibels (dB), −12 dB, and so on, compared to the peak output power) may reduce a power consumption of the PA.

The power combiner may combine output powers of the activated core amplifiers to provide the transmission signals with the desired output power. The power combiner may also filter undesired signals having a frequency equal to or higher than a high frequency threshold and/or equal to or below a low frequency threshold (e.g., outside of a transmission frequency range). Moreover, the power combiner may include an impedance matching network for matching an output impedance of the PA when providing the transmission signals to a load. For example, the impedance matching network may match (e.g., nearly match, approximately match) an output impedance of a transmitter including the PA when providing the transmission signals to one or more antennas for transmission. The power combiner may include a respective inductor and capacitor (e.g., an LC circuit) coupled to each of the core amplifiers.

In some cases, a transmitter including the PA may occupy a reduced circuit area based on having a combined amplification and filtering circuitry. For example, in such cases, the transmitter may not include additional and/or separate circuitry for filtering the undesired signals. Moreover, the power consumption of the transmitter may be reduced to improve efficiency when providing the transmission signals with a reduced output power. Various embodiments of the PA are described below with respect to a radio frequency (RF) wireless communication circuit. It should be appreciated that in alternative or additional embodiments, alternative or additional circuitry may also include the PA discussed herein.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 28. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 28 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network, a $6^{th}$ generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mmWave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 28 of the electronic device 10 may include any suitable source of power, such as a rechargeable lithium polymer (Li-poly) battery and/or an alternating current (AC) power converter.

Figure 2:
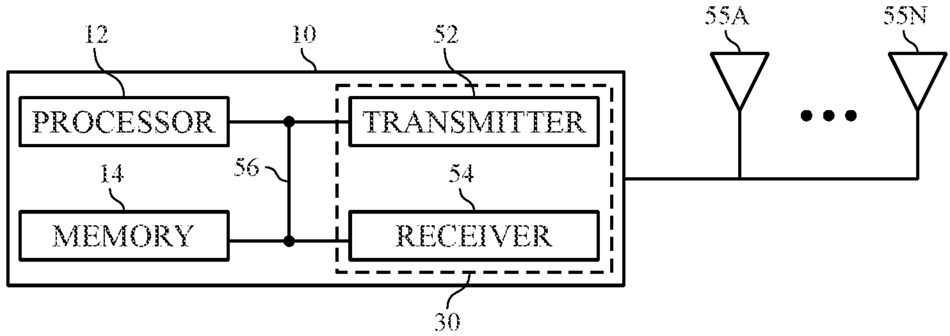
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive signals between one another.

The electronic device 10 may include the transmitter 52 and/or the receiver 54 that respectively enable transmission and reception of signals between the electronic device 10 and an external device via, for example, a network (e.g., including base stations or access points) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with one or more beams and various configurations. In some embodiments, multiple antennas of the antennas 55A-55N of an antenna group or module may be communicatively coupled to a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
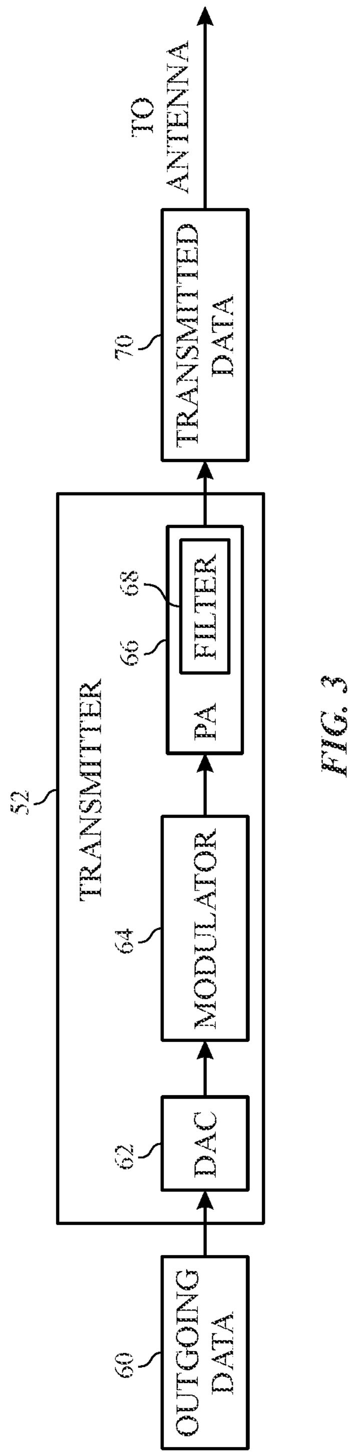
FIG. 3 is a schematic diagram of a transmitter of the electronic device of FIG. 1, according to embodiments of the present disclosure.

FIG. 3 is a schematic diagram of the transmitter 52 (e.g., transmit circuitry), according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal. A modulator 64 may combine the converted analog signal with a carrier signal to generate a radio wave.

A PA 66 may receive the modulated signal from the modulator 64. The PA 66 may amplify the modulated signal to a suitable level to drive transmission of the signal via the one or more antennas 55. The PA 66 may include a filter 68 to remove undesirable signals (e.g., noise) from the amplified signal. For example, the filter 68 may include a bandpass filter, a bandstop filter, a low pass filter, a high pass filter, and/or a decimation filter. As such, the transmitter 52 may not include additional filtering circuit when the PA 66 includes the filter 68 such that additional filtering of the amplified signal may be unnecessary. The PA 66 may generate transmitted signal 70 to be transmitted via the one or more antennas 55, as will be appreciated.

The PA 66 may be referred to as part of a radio frequency front end (RFFE), and more specifically, a transmit front end (TXFE) of the electronic device 10. Additionally, the transmitter 52 may include any suitable additional components not shown, or may not include certain of the illustrated components, such that the transmitter 52 may transmit the outgoing data 60 via the one or more antennas 55. For example, the transmitter 52 may include a mixer and/or a digital up converter.

Figure 4:
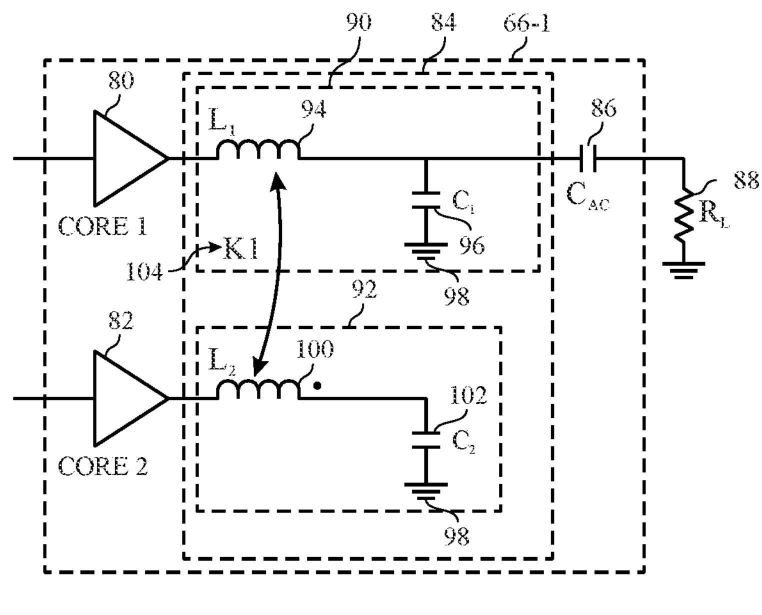
FIG. 4 is a block diagram of a power amplifier of the transmitter of FIG. 3 including two amplifiers and a power combiner, according to embodiments of the present disclosure.

FIG. 4 is a block diagram of a first embodiment 66-1 of the PA 66. The PA 66-1 may include a first core amplifier 80 and a second core amplifier 82 coupled to a power combiner 84. In the depicted embodiment, the PA 66-1 may also include an alternating current (AC) coupling capacitor 86 ($C_{AC}$) coupled to the power combiner 84. In alternative or additional embodiments, the PA 66-1 may not include the AC coupling capacitor 86. Moreover, the PA 66-1 may couple to a load 88 ($R_L$), such as the one or more antennas 55 described above.

The first core amplifier 80 and the second core amplifier 82 may each include an amplification circuit such as a switched capacitor amplifier circuit or a linear amplifier circuit, among other things. The first core amplifier 80 and the second core amplifier 82 may each amplify input signals (e.g., modulated signals) based on a respective gain when activated. For example, in some cases, the first core amplifier 80 and the second core amplifier 82 may receive differential input signals. In any case, in the depicted embodiment, the first core amplifier 80 and the second core amplifier 82 may provide amplified signals based on the respective gains.

Moreover, the first core amplifier 80 and the second core amplifier 82 may each receive a supply voltage to generate amplified signals with the respective gains. For example, the first core amplifier 80 and the second core amplifier 82 may each receive the supply voltage from the power source 28 discussed above. In some cases, activating or deactivating the first core amplifier 80 and/or the second core amplifier 82 may include applying the supply voltage to or removing the supply voltage from the first core amplifier 80 and/or the second core amplifier 82. Alternatively or additionally, the processor 12 may provide activation signals to activate the first core amplifier 80 and/or the second core amplifier 82.

The power combiner 84 may include a first LC circuit 90 coupled to the first core amplifier 80 and a second LC circuit 92 coupled to the second core amplifier 82. As such, the first LC circuit 90 may receive the amplified signals of the first core amplifier 80 and the second LC circuit 92 may receive the amplified signals of the second core amplifier 82. The first LC circuit 90 may include a first inductor 94 ($L_1$) and a first capacitor 96 ($C_1$) coupled to a ground connection 98 (e.g., zero volts, nearly zero volts, virtual ground, among other things). A first terminal of the first inductor 94 may couple to the first core amplifier 80 and a second terminal of the first inductor 94 may couple to the first capacitor 96 and the load 88 (e.g., via the AC coupling capacitor 86). Similarly, the second LC circuit 92 may include a second inductor 100 ($L_2$) and a second capacitor 102 ($C_2$) coupled to the ground connection 98. A first terminal of the second inductor 100 may couple to the second core amplifier 82 and a second terminal of the second inductor 100 may couple to the second capacitor 102.

In the depicted embodiment, the first inductor 94 and the second inductor 100 may inductively couple with a coupling factor 104 (K1) based on a distance 99 (e.g., in a first, horizontal direction 101) between first inductor 94 and the second inductor 100. For example, the first inductor 94 and the second inductor 100 may inductively couple when receiving the amplified signals of the first core amplifier 80 and the second core amplifier 82, respectively. As such, the first inductor 94 and the second inductor 100 may generate the transmitted signal 70 by combining the amplified signals of the first core amplifier 80 and the second core amplifier 82. For example, the first inductor 94 and the second inductor 100 may generate the transmitted signal 70 based on combining the amplified signals (e.g., the differential amplified signals). In the depicted embodiment, the first LC circuit 90 may be coupled to the load 88. Accordingly, the first LC circuit 90 of the power combiner 84 may provide the combined signals (e.g., the transmitted signal 70) to the load 88.

In some cases, the first capacitor 96 and the second capacitor 102 may have a similar (e.g., identical, matching) capacitance value and the first inductor 94 and the second inductor 100 may have a similar (e.g., identical, matching) inductance value. Alternatively or additionally, the first capacitor 96 and the second capacitor 102 may have different capacitance values and the first inductor 94 and the second inductor 100 may have different inductance values. In any case, the capacitance values and the inductance values may be based on a desired output power and/or frequency of the combined signals (e.g., the transmitted signal 70) and the supply voltage of the first core amplifier 80 and/or the second core amplifier 82.

In the depicted embodiment, the power combiner 84 may include the filter 68. Moreover, the filter 68 described herein may attenuate harmonic signals of transmission signals (e.g., by 10 dB, −20 dB, and so on). For example, the power combiner 84 may include a first series inductor (e.g., the first inductor 94) and a first shunt capacitor (e.g., the first capacitor 96) having inductance and capacitance values corresponding to a first filter. The first filter may correspond to the first LC circuit 90, a first portion of the filter 68, and/or a first low-pass filter. Moreover, the power combiner 84 may include a second series inductor (e.g., the second inductor 100) and a second shunt capacitor (e.g., the second capacitor 102) having inductance and capacitance values corresponding to a second filter (e.g., a second portion of the filter 68, a second low-pass filter). The second filter may correspond to the second LC circuit 92, a second portion of the filter 68, and/or a second low-pass filter. As such, in some embodiments, the filter 68 may include the first LC circuit 90 (e.g., the first filter) and the second LC circuit 92 (e.g., the second filter) to attenuate signals having a frequency equal to or above a high threshold and/or equal to or below a low threshold (e.g., outside a transmission frequency range, above 10 GHz, above 30 GHz, and so on).

Moreover, the first series inductor and the second series inductor of the power combiner 84 may magnetically couple (e.g., based on the first coupling factor 104 (K1)) to combine output powers of the first core amplifier 80 and the second core amplifier 82. Accordingly, as mentioned above, the first LC circuit 90 of the power combiner 84 may provide the combined signals (e.g., the transmitted signal 70) to the load 88. Furthermore, the transmitter 52 may not include additional filtering circuit when the power combiner 84 of the PA 66 provides filtering functionality such that additional filtering of the amplified signal may be unnecessary. That is, the PA 66 may filter signals having a frequency outside the transmission frequency range (e.g., above a threshold) by the first filter, the second filter, or more generally by the filter 68. As such, the transmitter 52 may occupy a reduced space (e.g., on a printed circuit board (PCB) and/or substrate).

In any case, in some embodiments, the first inductor 94 may be disposed in proximity (e.g., at a distance 99 in a first, horizontal direction 101 of the second inductor 100. Moreover, the distance 99 (e.g., in the first, horizontal direction 101) between conductive layers of the first inductor 94 and the second inductor 100 may correspond to the coupling factor 104 (K1) mentioned above. For example, the first inductor 94 and the second inductor 100 may be disposed in proximity of each other on a plane or layer (e.g., a metallic layer, air, vacuum, among other things). For example, different planes and/or layers discussed herein may be different layers of a PCB, among other things. As such, the first inductor 94 and the second inductor 100 may inductively couple to combine amplified signals of the first core amplifier 80 and the second core amplifier 82 based on the distance 99 between the first inductor 94 and the second inductor 100, as will be appreciated.

Figure 5:
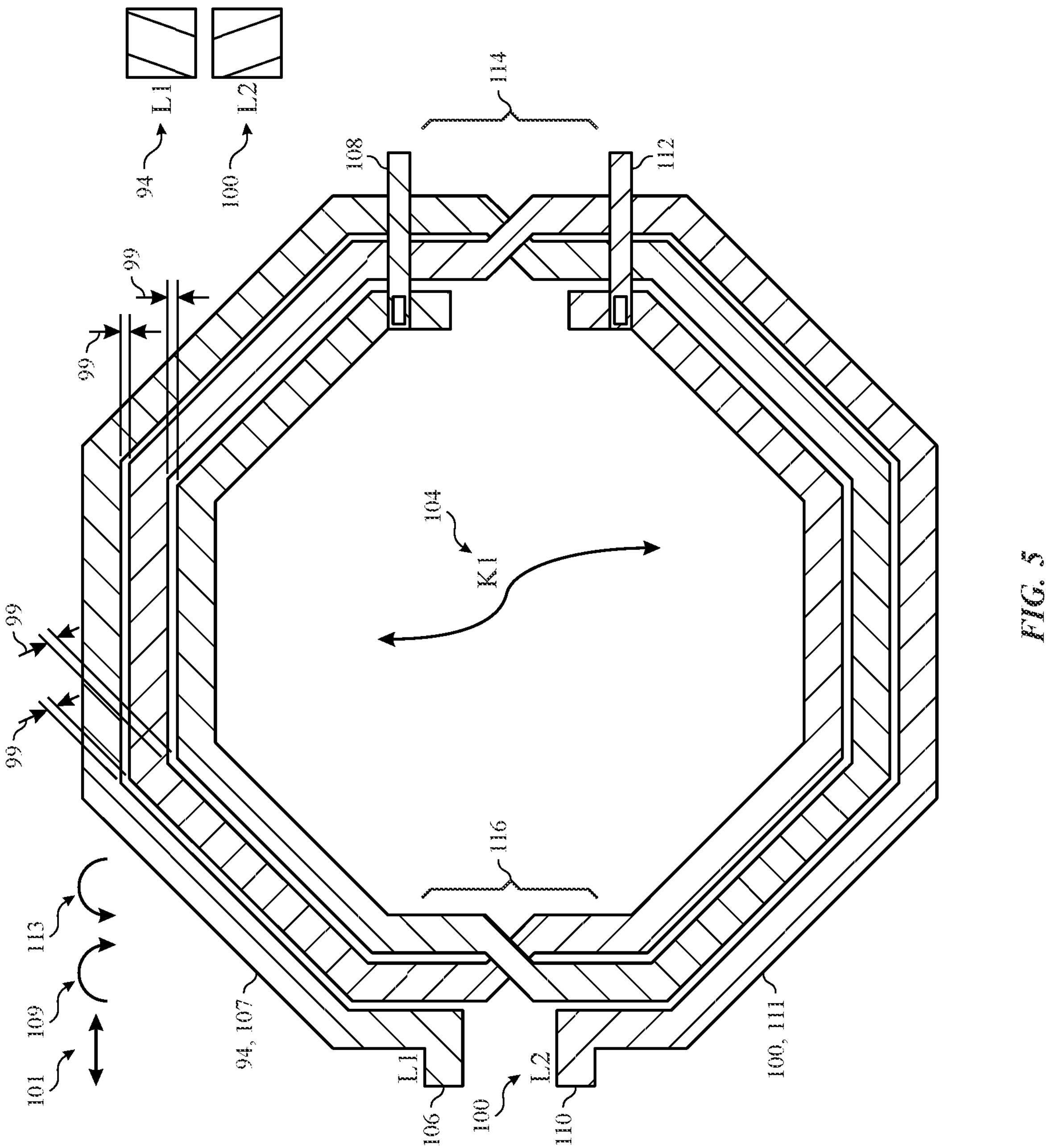
FIG. 5 is a layout of inductors of the power amplifier of FIG. 4, according to embodiments of the present disclosure.

FIG. 5 depicts an example layout 101 of the first inductor 94 and the second inductor 100 of the PA 66-1. In the depicted example, the PA 66-1 may include the first inductor 94 and the second inductor 100 disposed on (or within) a plane or layer of low loss materials (e.g., a metallic layer, air, vacuum, among other things). The first inductor 94 may input the amplified signals of the first core amplifier 80 at a first input terminal 106 and output the signals at a first output terminal 108. The second inductor 100 may input the amplified signals of the second core amplifier 82 at a second input terminal 110 and output the signals at a second output terminal 112. For example, the first input terminal 106 of the first inductor 94 and the second input terminal 110 of the second inductor 100 may receive the differential amplified signals.

Moreover, the first inductor 94 and the second inductor 100 may inductively couple based on the coupling factor 104 when receiving the amplified signals of the first core amplifier 80 and the second core amplifier 82. In this way, the first inductor 94 and the second inductor 100 may combine the amplified signals. As mentioned above, the first inductor 94 may be coupled to the load 88. As such, the amplified signals may traverse from the second inductor 100 to the first inductor 94. The first inductor 94 may provide the combined signals (e.g., the transmitted signal 70) to the load 88. Moreover, the first inductor 94 may be coupled to the first capacitor 96 and the second inductor 100 may be coupled to the second capacitor 102 forming the filter 68 (not shown). Accordingly, the first inductor 94, the first capacitor 96, the second inductor 100, and the second capacitor 102 may attenuate signals having a frequency equal to or above a high threshold and/or equal to or below a low threshold (e.g., within a desired transmission frequency range).

In the depicted embodiment, the first inductor 94 and the second inductor 100 may each include an octagonal shape layer. In particular, the first inductor 94 may include a first octagonal layer 107 spiraled (e.g., disposed in a circular shape) inward in a first, rotational clockwise direction 109. Moreover, the second inductor 100 may include a second octagonal layer 111 spiraled (e.g., disposed in a circular shape) inward in a second, rotational counter-clockwise direction 113. The first octagonal layer 107 of the first inductor 94 may be twisted under the second octagonal layer 111 of the second inductor 100 at a first position 114. Moreover, the first octagonal layer 107 of the first inductor 94 may be twisted over the second octagonal layer 111 of the second inductor 100 at a second position 116. As such, the first octagonal layer 107 may spiral inward and around the second octagonal layer 111. For example, the first inductor 94 and the second inductor 100 may be intertwined. In this way, the first octagonal layer 107 and the second octagonal layer 111 may include overlapping conductors (e.g., terminals). Moreover, the first output terminal 108 and the second output terminal 112 may extend across and out of the intertwined octagonal layers of the first inductor 94 and the second inductor 100. In this manner, the first output terminal 108 may couple to the first capacitor 96 and the load 88, and the second output terminal 112 may couple to the second capacitor 102.

With the foregoing in mind, it should be appreciated that a width and length of each side of the first octagonal layer and the second octagonal layer may be different in different embodiments. Moreover, in alternative or additional embodiments, the first inductor 94 and/or the second inductor 100 may include a circular layer, a rectangular layer, or a pentagonal layer, among other shapes. Moreover, in alternative or additional embodiments, a position of the first input terminal 106, the second input terminal 110, the first output terminal 108, and/or the second output terminal 112 may be altered to any viable form or position. Furthermore, in alternative or additional embodiments, the first inductor 94 may be twisted over or under the second inductor 100 at different positions. In any case, the PA 66-1 may generate the combined signal by combining amplified signals of the first core amplifier 80 and the second core amplifier 82 using the first octagonal layer of the first inductor 94 and the second octagonal layer of the second inductor 100.

Figure 6:
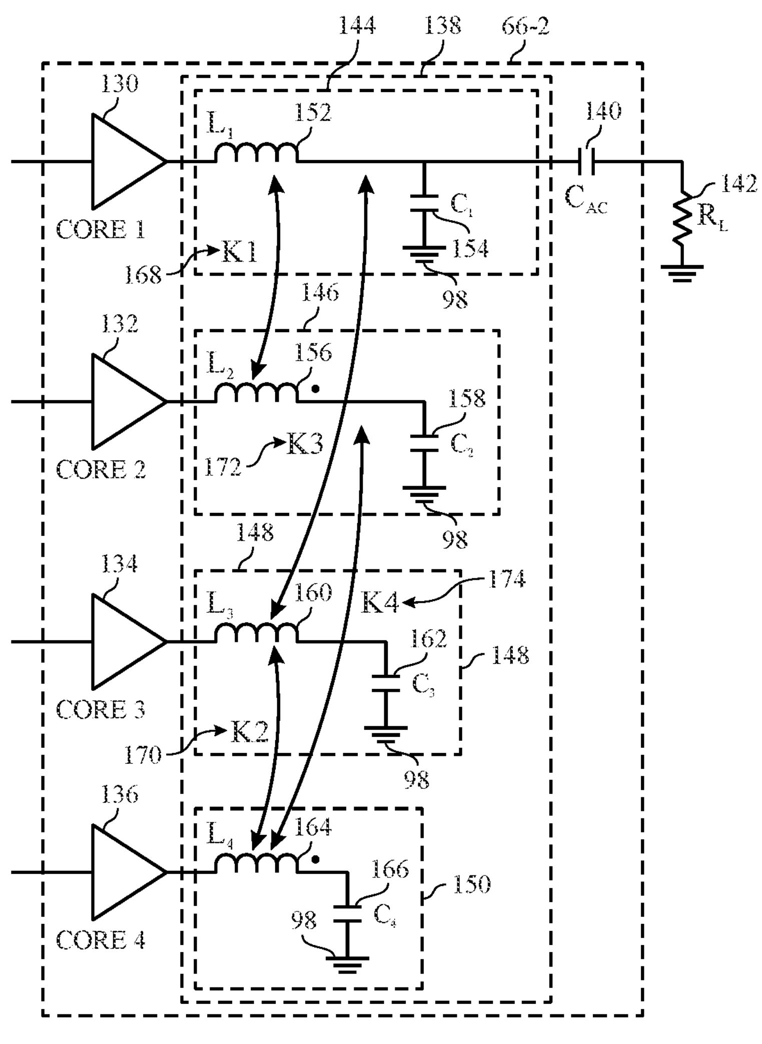
FIG. 6 is a block diagram of a power amplifier of the transmitter of FIG. 3 including at least four core amplifiers and a power combiner, according to embodiments of the present disclosure.

FIG. 6 is a block diagram of a second embodiment 66-2 of the PA 66. The PA 66-2 may include a first core amplifier 130, a second core amplifier 132, a third core amplifier 134, and a fourth core amplifier 136 coupled to a power combiner 138. In the depicted embodiment, the PA 66-2 may also include an AC coupling capacitor 140 ($C_{AC}$) coupled to the power combiner 138. In alternative or additional embodiments, the PA 66-2 may not include the AC coupling capacitor 140. Similar to the PA 66-1 discussed above, the PA 66-2 may couple to a load 142 ($R_L$), such as the one or more antennas 55 described above.

The first core amplifier 130, the second core amplifier 132, the third core amplifier 134, and the fourth core amplifier 136 may each include an amplification circuit, such as a switched capacitor amplifier circuit or a linear amplifier circuit, among other things. The first core amplifier 130, the second core amplifier 132, the third core amplifier 134, and the fourth core amplifier 136 may each amplify input signals (e.g., modulated signals) based on a respective gain when activated. For example, in some cases, the first core amplifier 130 and the second core amplifier 132 may receive a first differential input signal and the third core amplifier 134 and the fourth core amplifier 136 may receive a second differential input signal.

In some cases, a circuit (e.g., the modulator 64 discussed above) may provide a single signal (e.g., the modulated signal) differentially to the first core amplifier 130 and the second core amplifier 132 and also the third core amplifier 134 and the fourth core amplifier 136. For example, the first core amplifier 130 and the third core amplifier 134 may receive the differential signal having a first polarity and the second core amplifier 132 and the fourth core amplifier 136 may receive the differential signal having a second polarity. In any case, in the depicted embodiment, the first core amplifier 130, the second core amplifier 132, the third core amplifier 134, and the fourth core amplifier 136 may provide amplified signals based on the respective gains. For example, the first core amplifier 130 and the second core amplifier 132 may generate first differential amplified signals and the third core amplifier 134 and the fourth core amplifier 136 may generate second differential amplified signals.

Moreover, the first core amplifier 130, the second core amplifier 132, the third core amplifier 134, and the fourth core amplifier 136 may each receive a supply voltage to generate amplified signals with the respective gains. In some embodiments, the first core amplifier 130, the second core amplifier 132, the third core amplifier 134, and the fourth core amplifier 136 may each receive the supply voltage from the power source 28 discussed above. In some cases, activating or deactivating the first core amplifier 130, the second core amplifier 132, the third core amplifier 134, and/or the fourth core amplifier 136 may include applying the supply voltage to or removing the supply voltage from the respective circuits.

The power combiner 138 may include a first LC circuit 144 coupled to the first core amplifier 130, a second LC circuit 146 coupled to the second core amplifier 132, a third LC circuit 148 coupled to the third core amplifier 134, and a fourth LC circuit 150 coupled to the fourth core amplifier 136. As such, the first LC circuit 144 may receive the amplified signals of the first core amplifier 130. The second LC circuit 146 may receive the amplified signals of the second core amplifier 132. Moreover, the third LC circuit 148 may receive the amplified signals of the third core amplifier 134. Furthermore, the fourth LC circuit 150 may receive the amplified signals of the fourth core amplifier 136.

The first LC circuit 144 may include a first inductor 152 ($L_1$) and a first capacitor 154 ($C_1$) coupled to the ground connection 98. The second LC circuit 146 may include a second inductor 156 ($L_2$) and a second capacitor 158 ($C_2$) coupled to the ground connection 98. Moreover, the third LC circuit 148 may include a third inductor 160 ($L_3$) and a third capacitor 162 ($C_3$) coupled to the ground connection 98. A first terminal of the third inductor 160 may couple to the third core amplifier 134 and a second terminal of the third inductor 160 may couple to the third capacitor 162. Furthermore, the fourth LC circuit 150 may include a fourth inductor 164 ($L_4$) and a fourth capacitor 166 ($C_4$) coupled to the ground connection 98. Similarly, a first terminal of the fourth inductor 164 may couple to the fourth core amplifier 136 and a second terminal of the fourth inductor 164 may couple to the fourth capacitor 166. Moreover, the first inductor 152 may couple to the first core amplifier 130, the second inductor 156 may couple to the second core amplifier 132, the third inductor 160 may couple to the third core amplifier 134, and the fourth inductor 164 may couple to the fourth core amplifier 136.

In some embodiments, the first capacitor 154, the second capacitor 158, the third capacitor 162, and the fourth capacitor 166 may have a similar (e.g., identical or matching) capacitance value. Moreover, the first inductor 152, the second inductor 156, the third inductor 160, and the fourth inductor 164 may have a similar (e.g., identical or matching) inductance value. Alternatively or additionally, the first capacitor 154, the second capacitor 158, the third capacitor 162, and the fourth capacitor 166 may have different capacitance values and the first inductor 152, the second inductor 156, the third inductor 160, and the fourth inductor 164 may have different inductance values. In any case, the capacitance values and the inductance values may be based on a desired output power and/or frequency of the combined signals (e.g., the transmitted signal 70) and the supply voltage.

In the depicted embodiment, the power combiner 138 may include the filter 68. Moreover, the filter 68 described herein may attenuate harmonic signals of transmission signals (e.g., by 10 dB, −20 dB, and so on). For example, the power combiner 84 may include a first series inductor (e.g., the first inductor 152) and a first shunt capacitor (e.g., the first capacitor 154) having inductance and capacitance values corresponding to a first filter. The first filter may correspond to the first LC circuit 144, a first portion of the filter 68, and/or a first low-pass filter. The power combiner 84 may include a second series inductor (e.g., the second inductor 156) and a second shunt capacitor (e.g., the second capacitor 158) having inductance and capacitance values corresponding to a second filter (e.g., a second portion of the filter 68, a second low-pass filter). The second filter may correspond to the second LC circuit 146, a second portion of the filter 68, and/or a second low-pass filter.

Moreover, the power combiner 84 may include a third series inductor (e.g., the third inductor 160) and a third shunt capacitor (e.g., the third capacitor 162) having inductance and capacitance values corresponding to a third filter (e.g., a third portion of the filter 68, a third low-pass filter). The third filter may correspond to the third LC circuit 148, a second portion of the filter 68, and/or a second low-pass filter. Furthermore, the power combiner 84 may include a fourth series inductor (e.g., the fourth inductor 164) and a fourth shunt capacitor (e.g., the fourth capacitor 166) having inductance and capacitance values corresponding to a fourth filter (e.g., a fourth portion of the filter 68, a fourth low-pass filter). The fourth filter may correspond to the fourth LC circuit 150, a fourth portion of the filter 68, and/or a second low-pass filter. As such, in some embodiments, the filter 68 (e.g., a low-pass filter) may include the first LC circuit 144 (e.g., the first filter), the second LC circuit 146 (e.g., the second filter), the third LC circuit 148 (e.g., the third filter), and the fourth LC circuit 150 (e.g., the fourth filter). In any case, the filter 68 may attenuate signals having a frequency equal to or above a high threshold and/or equal to or below a low threshold (e.g., outside a transmission frequency range, above 10 GHz, above 30 GHz, and so on).

For example, the first inductor 152 and the second inductor 156 may inductively couple with a first coupling factor 168 (K1), the third inductor 160 and the fourth inductor 164 may inductively couple with a second coupling factor 170 (K2), the first inductor 152 and the third inductor 160 may inductively couple with a third coupling factor 172 (K3), and the second inductor 156 and the fourth inductor 164 may inductively couple with a fourth coupling factor 174 (K4). Moreover, the first series inductor and the second series inductor of the power combiner 84 may magnetically couple (e.g., based on the first coupling factor 168 (K1)) to combine output powers of the first core amplifier 130 and the second core amplifier 132.

Furthermore, the third series inductor and the fourth series inductor of the power combiner 84 may magnetically couple (e.g., based on the second coupling factor 168 (K2)) to combine output powers of the third core amplifier 134 and the fourth core amplifier 136. The first series inductor and the third series inductor of the power combiner 84 may magnetically couple (e.g., based on the third coupling factor 172 (K3)) to combine output powers of the first core amplifier 130 and the third core amplifier 134. Moreover, the second series inductor and the fourth series inductor of the power combiner 84 may magnetically couple (e.g., based on the fourth coupling factor 174 (K4)) to combine output powers of the second core amplifier 132 and the fourth core amplifier 136.

Accordingly, as mentioned above, the first LC circuit 144 of the power combiner 138 may provide the combined signals (e.g., the transmitted signal 70) to the load 144. Furthermore, the transmitter 52 may not include additional filtering circuit when the power combiner 138 of the PA 66 provides filtering functionality such that additional filtering of the amplified signal may be unnecessary. That is, the PA 66 may filter signals having a frequency outside the transmission frequency range (e.g., above a threshold) by the first filter, the second filter, the third filter, the fourth filter, or more generally by the filter 68. As such, the transmitter 52 may occupy a reduced space (e.g., on a printed circuit board (PCB) and/or substrate) based on including the PA 66-2. Moreover, although four LC circuits are depicted in the embodiment of FIG. 6, in alternative or additional embodiments, the PA 66 may include additional number of LC circuits (e.g., 3, 4, and so on) having inductors that may magnetically couple to combine amplified signals and filter the signals having a frequency outside the transmission frequency range (e.g., above a threshold).

Figure 7:
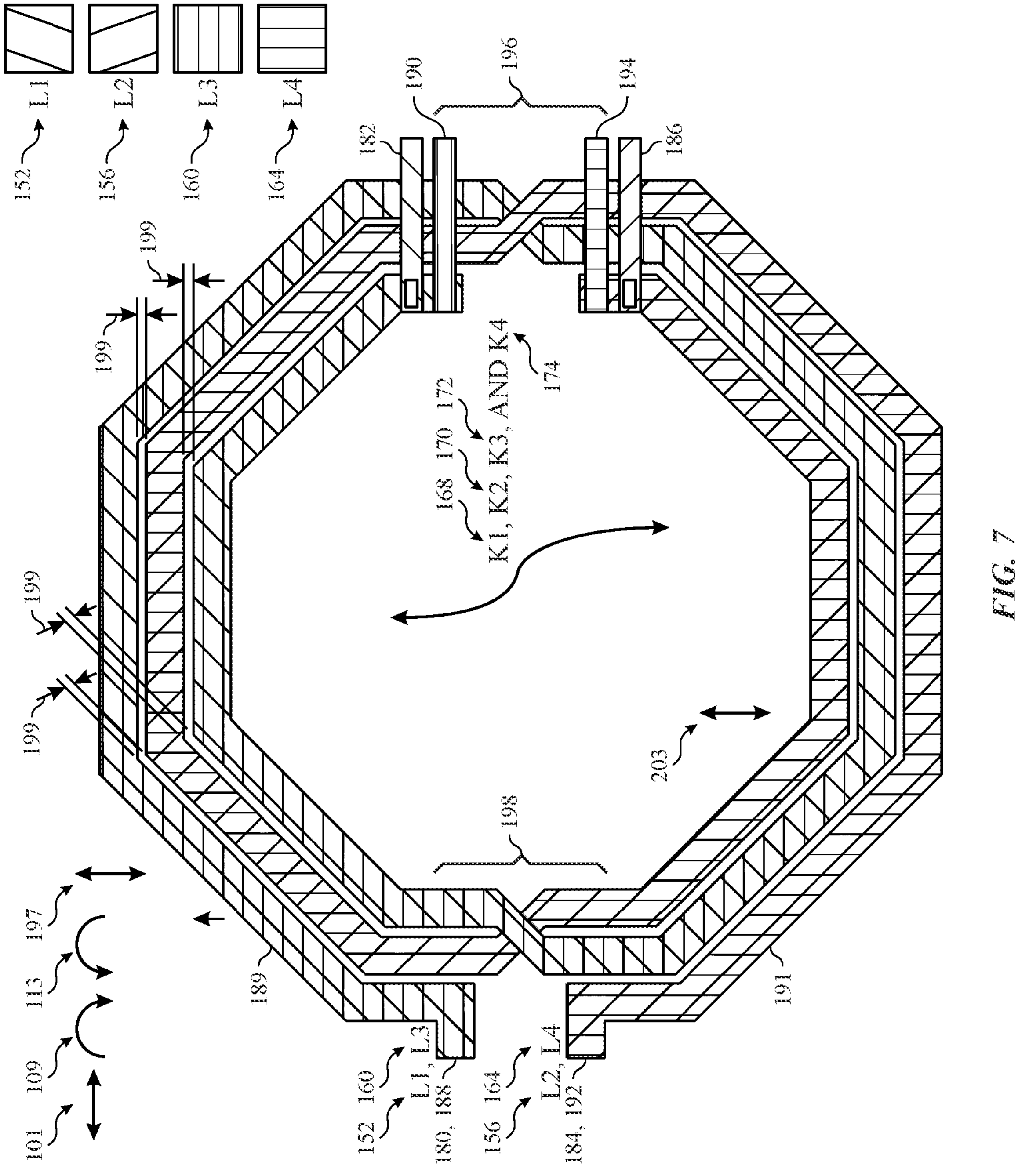
FIG. 7 is a layout of inductors of the power amplifier of FIG. 4 and/or FIG. 6, according to embodiments of the present disclosure.

Referring now FIG. 7, an example layout of the first inductor 152, the second inductor 156, the third inductor 160, and the fourth inductor 164 of the PA 66-2 is shown. The first inductor 152 may input the amplified signals of the first core amplifier 130 at a first input terminal 180 and output the signals at a first output terminal 182. The second inductor 156 may input the amplified signals of the second core amplifier 132 at a second input terminal 184 and output the signals at a second output terminal 186. Moreover, the third inductor 160 may input the amplified signals of the third core amplifier 134 at a third input terminal 188 and output the signals at a third output terminal 190. Furthermore, the fourth inductor 164 may input the amplified signals of the fourth core amplifier 136 at a fourth input terminal 192 and output the signals at a fourth output terminal 194. For example, the first input terminal 180 of the first inductor 152 and the second input terminal 184 of the second inductor 156 may receive the first differential amplified signals and the third input terminal 188 of the third inductor 160 and the fourth input terminal 192 of the fourth inductor 164 may receive the second differential amplified signals.

In the depicted embodiment, the first inductor 152, the second inductor 156, the third inductor 160, and the fourth inductor 164 may each include an octagonal shape layer. In particular, the first inductor 152 may include a first octagonal layer 189 that is directed or spirals inward in a first rotational (e.g., clockwise) direction 109. The second inductor 156 may include a second octagonal layer 191 that is directed or spiraling inward in a second rotational (e.g., counter-clockwise) direction 113. The first rotational (e.g., clockwise) direction 113 may be opposite that of the second (e.g., counter-clockwise) rotational direction 113. Moreover, the third inductor 160 may include a third octagonal layer that is directed or spiraling inward in the first rotational (e.g., clockwise) direction 109. For example, the first octagonal layer 189 may be disposed over the third octagonal layer (e.g., in a second, vertical direction 197). The second direction 197 may be orthogonal, normal, form a 90 degree angle with, or intersect the first rotational (e.g., clockwise) direction 109 and/or the second rotational (e.g., counter-clockwise) direction 113. Furthermore, the fourth inductor 164 may include a fourth octagonal layer that is directed or spiraling inward in the second rotational (e.g., counter-clockwise) direction 113. For example, the second octagonal layer 191 may be disposed over (e.g., in the second direction 197) the fourth octagonal layer.

The first octagonal layer 189 of the first inductor 152 may be twisted under the second octagonal layer 191 of the second inductor 156 at a first position 196. Moreover, the first octagonal layer 189 of the first inductor 152 may be twisted over the second octagonal layer 191 of the second inductor 156 at a second position 198. As such, the first octagonal layer 189 may spiral or be directed inward and around the second octagonal layer 191. For example, the first inductor 152 and the second inductor 156 may be intertwined. In this way, the first octagonal layer 189 and the second octagonal layer 191 may include overlapping conductors (e.g., terminals). In some embodiments, the third inductor 160 and the fourth inductor 164 may also be intertwined similarly and disposed below the first inductor 152 and the second inductor 156.

Moreover, the first output terminal 182, the second output terminal 186, the third output terminal 190, and the fourth output terminal 194 may extend across and out of the intertwined octagonal layers of the first inductor 152, the second inductor 156, the third inductor 160, and the fourth inductor 164. Accordingly, the first output terminal 182 may couple to the first capacitor 154 and the load 142. Moreover, the second output terminal 186 may couple to the second capacitor 158, the third output terminal 190 may couple to the third capacitor 162, and the fourth output terminal 194 may couple to the fourth capacitor 166.

The first inductor 152 may be disposed in distance 199 (e.g., in the first, horizontal direction 101) from the second inductor 156. For example, the first inductor 152 and the second inductor 156 may be disposed in proximity of each other on a first plane or layer (e.g., a metallic layer, air, vacuum, among other things). Accordingly, the first inductor 152 and the second inductor 156 may inductively couple based on the first coupling factor 168 (K1) when receiving the amplified signals of the first core amplifier 130 and the second core amplifier 132 respectively. For example, the distance 199 (e.g., in the first, horizontal direction 101) between conductive layers of the first inductor 152 and the second inductor 156 may correspond to the first coupling factor 168. As such, the amplified signals may traverse from the second inductor 156 to the first inductor 152. Accordingly, the first inductor 152 and the second inductor 156 may combine the amplified signals of the first core amplifier 80 and the second core amplifier 82 when receiving the amplified signals of the first core amplifier 130 and the second core amplifier 132 respectively.

The third inductor 160 may be disposed in a distance 199 (e.g., in the first, horizontal direction 101) from the fourth inductor 164. For example, the third inductor 160 and the fourth inductor 164 may be disposed in proximity of each other on a second plane or layer (e.g., a metallic layer, air, vacuum, among other things). Accordingly, the third inductor 160 and the fourth inductor 164 may inductively couple based on the second coupling factor 170 (K2) based on the distance 199 (e.g., in the first, horizontal direction 101) between third inductor 160 and the fourth inductor 164 on the second plane or layer. For example, the third inductor 160 and the fourth inductor 164 may inductively couple when receiving the amplified signals of the third core amplifier 134 and the fourth core amplifier 136 respectively. For example, the distance 199 (e.g., in the first, horizontal direction 101) between conductive layers of the third inductor 160 and the fourth inductor 164 may correspond to the first coupling factor 168. As such, the amplified signals may traverse from the fourth inductor 164 to the third inductor 160 (or vice versa). Accordingly, the third inductor 160 and the fourth inductor 164 may combine the amplified signals of the third core amplifier 134 and the fourth core amplifier 136 when receiving the amplified signals of the third core amplifier 134 and the fourth core amplifier 136 respectively.

With the foregoing in mind, the first plane or layer including the first inductor 152 and the second inductor 156 may be disposed in vertical proximity (e.g., vertical distance, distance at a second direction, distance at a perpendicular direction) of the second plane or layer the third inductor 160 and the fourth inductor 164. Moreover, the first inductor 152 may be laid over on the third inductor 160 and the second inductor 156 may be disposed on the fourth inductor 164. That is, the first inductor 152 may be disposed in a distance 203 (e.g., in the second, vertical direction 197) from the third inductor 160. Moreover, as shown in FIG. 6, the first LC circuit 144 may be coupled to the load 142. As such, the amplified signals may traverse from the third inductor 160 to the first inductor 152. Accordingly, the first inductor 152 and the third inductor 160 may inductively couple based on the third coupling factor 172 (K3) based on vertical distance 203 between first inductor 152 and the third inductor 160. For example, the first inductor 152 and the third inductor 160 may inductively couple when receiving the amplified signals of the first core amplifier 130 and the third core amplifier 134 respectively. For example, the vertical distance between conductive layers of the first inductor 152 and the third inductor 160 may correspond to the third coupling factor 172. As such, the first inductor 94 and the third inductor 160 may combine the amplified signals of the first core amplifier 80 and the third core amplifier 134.

Similarly, the second inductor 156 may be disposed in the distance 203 (e.g., in the second, vertical direction 197) from the fourth inductor 164. As such, the amplified signals may traverse from the fourth inductor 164 to the second inductor 156. Accordingly, the second inductor 156 and the fourth inductor 164 may inductively couple based on the fourth coupling factor 174 (K4) based on distance 203 between second inductor 156 and the fourth inductor 164. For example, the second inductor 156 and the fourth inductor 164 may inductively couple when receiving the amplified signals of the second core amplifier 132 and the fourth core amplifier 136 respectively. For example, the distance 203 between conductive layers of the second inductor 156 and the fourth inductor 164 may correspond to the fourth coupling factor 174. As such, the second inductor 100 and the fourth inductor 164 may combine the amplified signals of the second core amplifier 82 and the fourth core amplifier 136.

As such, the first inductor 152, the second inductor 156, the third inductor 160, and the fourth inductor 164 may combine the amplified signals to generate the transmitted signal 70. Moreover, as shown in FIG. 6, the first LC circuit 144 may be coupled to the load 142. Accordingly, the first LC circuit 144 of the power combiner 138 may provide the combined signals (e.g., the transmitted signal 70) to the load 142. As such, the first inductor 152, the second inductor 156, the third inductor 160, and the fourth inductor 164 may generate the transmitted signal 70 based on combining the amplified signals (e.g., the differential amplified signals).

With the foregoing in mind, it should be appreciated that a width and length of each side of the first octagonal layer, the second octagonal layer, the third octagonal layer, and the fourth octagonal layer may be different in different embodiments. Moreover, in alternative or additional embodiments, the first inductor 152, the second inductor 156, the third inductor 160, and/or the fourth inductor 164 may include a circular layer, a rectangular layer, or a pentagonal layer, among other shapes. Moreover, in alternative or additional embodiments, a position of the first input terminal 180, the second input terminal 184, the third input terminal 188, the fourth input terminal 192, the first output terminal 182, the second output terminal 186, the third output terminal 190, and/or the fourth output terminal 194 may be altered to any viable form or position. Furthermore, in alternative or additional embodiments, the first inductor 152 may be twisted over or under the second inductor 156 at different positions. Similarly, the third inductor 160 may be twisted over or under the fourth inductor 164 at different positions.

In any case, the PA 66 may generate the combined signal by combining amplified signals of the first core amplifier 130, the second core amplifier 132, the third core amplifier 134, and/or the fourth core amplifier 136 using the first octagonal layer of the first inductor 152, the second octagonal layer of the second inductor 156, the third octagonal layer of the third inductor 160, and the fourth octagonal layer of the fourth inductor 164. Furthermore, although the depicted PA 66 includes two planes (e.g., the first plane and the second plane), in alternative or additional embodiments, the PA 66 may include additional number of planes (e.g., 3, 4, 5, and so on). That is, although four sets of core amplifiers, inductors, and capacitors are discussed above, it should be appreciated that in alternative or additional embodiments, different number of (e.g., 6, 8, 10, 12, and so on) sets of core amplifiers, inductors, and capacitors may be disposed to horizontally and vertically couple inductors to combine and generate PA output signals.

Accordingly, the first octagonal layer of the first inductor 152, the second octagonal layer of the second inductor 156, the third octagonal layer of the third inductor 160, and the fourth octagonal layer of the fourth inductor 164 may combine and filter the respective amplified signals. As such, the first octagonal layer of the first inductor 152, the second octagonal layer of the second inductor 156, the third octagonal layer of the third inductor 160, and the fourth octagonal layer of the fourth inductor 164 may generate and provide the transmitted signal 70 by attenuating undesired signals (e.g., harmonic signals, signals outside a transmission frequency range) to the load 144. Accordingly, the transmitter 52 may not include additional filtering circuit when the power combiner 138 of the PA 66 provides filtering functionality such that additional filtering of the amplified signal may be unnecessary. As such, the transmitter 52 including the PA 66-1 and/or the PA 66-2 may occupy a reduced space (e.g., on a printed circuit board (PCB) and/or substrate).

Figure 8:
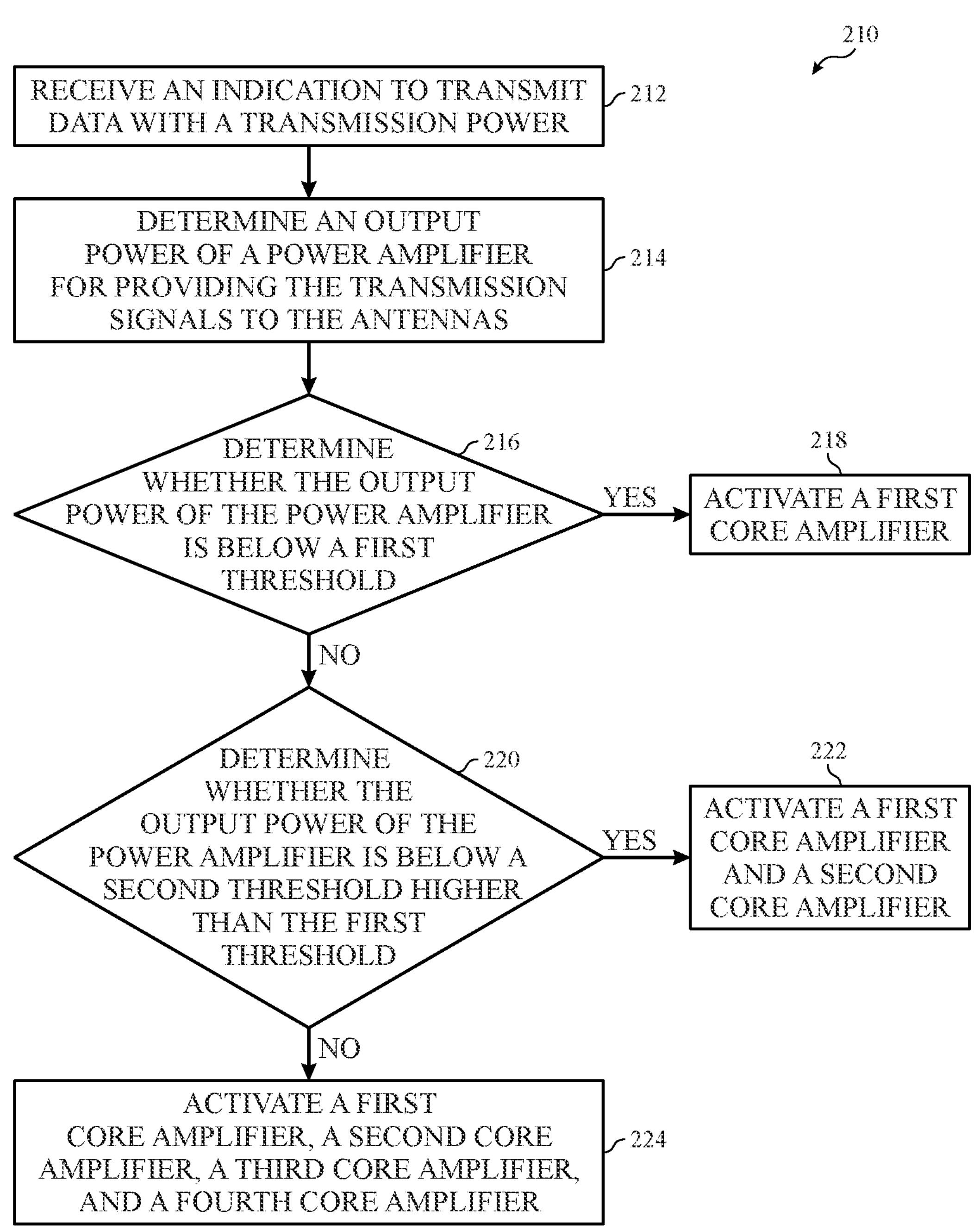
FIG. 8 is a process for data transmission by transmitter of the electronic device of FIG. 1 including the power amplifier of FIGS. 4-7, according to embodiments of the present disclosure.

FIG. 8 is a process 210 for data transmission by the electronic device 10 described above including the PA 66. The processor 12 is described to perform the operations associated with process blocks described herein. In some embodiments, the process 210 may be implemented by executing instructions stored in a tangible, non-transitory, computer-readable medium, such as the memory 14 or storage 16, using the processor 12. Although specific blocks are described in the depicted embodiment, it should be appreciated that in alternative or additional embodiments, the controller 124 may perform alternative or additional processes. Moreover, although the process blocks are described in a particular order, it should be appreciated that the process blocks may be performed in any other viable order.

At block 212, the processor 12 receives an indication (e.g., a request) to transmit data via the one or more antennas 55. In some cases, the indication may include one or more signals indicative of an amplitude and/or a transmission power for providing the transmission signals to the one or more antennas 55. Alternatively or additionally, the one or more signals may indicate an output power of the PA 66 providing the transmission signals to the one or more antennas 55.

In any case, at block 214, the processor 12 may determine the output power of the PA 66 for providing the transmission signals to the one or more antennas 55. Moreover, at block 216, the processor 12 may determine whether the output power of the PA 66 is below a first threshold. For example, the first threshold may correspond to an amount of output power (e.g., 12 dB) less than a peak output power of the PA 66. In some cases, the first core amplifier 80 or 130 discussed above may generate an output power below the first threshold. At block 218, when the output power of the PA 66 is below the first threshold, the processor 12 may activate the first core amplifier 80 or 130. As such, the PA 66-1 or 66-2 may provide the transmission signals with the determined output power to the one or more antennas 55. Alternatively, when the output power of the PA 66 is not below the first threshold, the processor 12 may proceed to block 220.

At block 220, the processor 12 determines whether the output power of the PA 66 is below a second threshold higher than the first threshold. For example, the second threshold may correspond to an amount of output power (e.g., 6 dB) less than the peak output power of the PA 66. In some cases, a combination (or aggregation) of output powers of the first core amplifier 80 or 130 and the second core amplifier 82 or 132 discussed above may be below the second threshold. As such, at block 222, when the output power of the PA 66 is below the second threshold, the processor 12 activates the first core amplifier 80 or 130 and the second core amplifier 82 or 132. As such, the PA 66-1 or 66-2 may provide the transmission signals with the determined output power to the one or more antennas 55. Alternatively, when the output power of the PA 66 is not below the second threshold, the processor 12 proceeds to block 224.

At block 224, the processor 12 activates the first core amplifier 130, the second core amplifier 132, the third core amplifier 134, and the fourth core amplifier 136 when the transmission power is equal to or above the second threshold. For example, the PA may generate an amount of output power at or close to the peak output power. In some embodiments, the PA 66-2 may generate the output power based on combining (or aggregating) output powers of the first core amplifier 130, the second core amplifier 132, the third core amplifier 134, and the fourth core amplifier 136. As such, the PA 66-2 may provide the transmission signals with the determined output power to the one or more antennas 55. In any case, the one or more antennas 55 may transmit the data with the transmission power.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. A power amplifier comprising:
- a first core amplifier configured to provide a first amplified signal;
- a second core amplifier configured to provide a second amplified signal; and
- a power combiner configured to couple to a load, the power combiner comprising
  - a first inductor having a first terminal coupled to the first core amplifier,
  - a first capacitor coupled to a second terminal of the first inductor,
  - a second inductor having a third terminal coupled to the second core amplifier, the first inductor and the second inductor being disposed on a first plane and configured to inductively couple, and
  - a second capacitor coupled to a fourth terminal of the second inductor.

2. The power amplifier of claim 1, wherein the first core amplifier comprises a switched capacitor amplifier, a linear amplifier, or both.

3. The power amplifier of claim 1, wherein the first core amplifier is configured to provide the first amplified signal by amplifying an input signal by a first gain.

4. The power amplifier of claim 1, wherein the first inductor and the second inductor are configured to inductively couple on the first plane based on a first coupling factor, wherein the first coupling factor is based on a distance between the first inductor and the second inductor in a direction along the first plane.

5. The power amplifier of claim 1, wherein the first inductor and the second inductor are configured to inductively couple when the first inductor is receiving the first amplified signal and the second inductor is receiving the second amplified signal.

6. The power amplifier of claim 1, wherein the first inductor and the second inductor have overlapping terminals on the first plane.

7. The power amplifier of claim 1, comprising a third core amplifier configured to provide a third amplified signal, the power combiner comprising a third inductor having a fifth terminal coupled to the third core amplifier and a third capacitor coupled to a sixth terminal of the third inductor.

8. The power amplifier of claim 7, comprising a fourth core amplifier configured to provide a fourth amplified signal, the power combiner comprising a fourth inductor having a seventh terminal coupled to the fourth core amplifier, the third inductor and the fourth inductor overlapping on a second plane, the third inductor and the fourth inductor configured to inductively couple in a first direction along the second plane, and a fourth capacitor coupled to an eighth terminal of the fourth inductor.

9. The power amplifier of claim 8, the third inductor being disposed over the first inductor in a second direction orthogonal to the first direction, the first inductor and the third inductor configured to inductively couple in the second direction based on a first distance between the first inductor and the third inductor in the second direction, the fourth inductor being disposed over the second inductor in the second direction, the second inductor and the fourth inductor configured to inductively couple in the second direction based on a second distance between the first inductor and the third inductor in the second direction.

10. An electronic device comprising:

a processor;

one or more antennas; and a power combiner coupled to the one or more antennas, the power combiner comprising a first core amplifier coupled to the processor, a second core amplifier coupled to the processor, a third core amplifier, a first inductor having a first terminal coupled to the first core amplifier, a second inductor having a second terminal coupled to the second core amplifier, the first inductor and the second inductor being disposed on a first plane and configured to inductively couple, and a third inductor having a third terminal of the third inductor coupled to the third core amplifier disposed on the first plane.

11. The electronic device of claim 10, wherein the first core amplifier is configured to provide a first amplified signal in response to receiving activation signals from the processor and the second core amplifier is configured to provide a second amplified signal in response to receiving additional activation signals from the processor.

12. The electronic device of claim 11, wherein the power combiner is configured to combine the first amplified signal and the second amplified signal, the power combiner configured to provide a combined amplified signal to the one or more antennas for transmission.

13. The electronic device of claim 10, wherein the power combiner comprises a first capacitor coupled to a fourth terminal of the first inductor and the one or more antennas, and a second capacitor coupled to a fifth terminal of the second inductor.

14. The electronic device of claim 13, comprising a fourth core amplifier, the power combiner comprising a third capacitor coupled to a sixth terminal of the third inductor, a fourth inductor having a seventh terminal coupled to the fourth core amplifier, the third inductor and the fourth inductor being disposed on a second plane, and a fourth capacitor coupled to a eighth terminal of the fourth inductor.

15. A method comprising:

receiving, by a processor, a request to transmit transmission signals via one or more antennas of an electronic device;

receiving, by the processor, an output power of a power amplifier of the electronic device for providing the transmission signals to the one or more antennas;

activating, by the processor, a first core amplifier of the power amplifier based on the output power being below a first threshold; and activating, by the processor, the first core amplifier and a second core amplifier of the power amplifier based on the output power being below a second threshold higher than the first threshold.

16. The method of claim 15, wherein the power amplifier provides the transmission signals to the one or more antennas with the output power having a value below the first threshold based on activating the first core amplifier.

17. The method of claim 15, wherein the power amplifier provides the transmission signals to the one or more antennas with the output power having a value above the first threshold and below the second threshold based on activating the first core amplifier and the second core amplifier.

18. The method of claim 15, comprising activating the first core amplifier, the second core amplifier, a third core amplifier, and a fourth core amplifier of the power amplifier based on the output power being equal to or above the second threshold.

19. The method of claim 18, wherein the power amplifier provides the transmission signals to the one or more antennas with the output power having a value equal to or above the second threshold based on activating the first core amplifier, the second core amplifier, the third core amplifier, and the fourth core amplifier.

* * * * *